United States Patent [19]

Snaper

[11] Patent Number: 4,642,635
[45] Date of Patent: Feb. 10, 1987

[54] REMOTE METER READING SYSTEM

[76] Inventor: Alvin A. Snaper, 2800 Cameo Cir., Las Vegas, Nev. 89107

[21] Appl. No.: 626,207

[22] Filed: Jun. 29, 1984

Related U.S. Application Data

[63] Continuation-in-part of Ser. No. 326,020, Nov. 30, 1981, abandoned.

[51] Int. Cl.⁴ .............................................. H04Q 9/00
[52] U.S. Cl. .................................. 379/107; 370/870.03
[58] Field of Search .................... 340/870.02, 870.03, 340/870.07, 870.18, 870.19, 870.26; 179/2 A, 2 AM

[56] References Cited

U.S. PATENT DOCUMENTS

| | | | |
|---|---|---|---|
| 3,588,357 | 6/1971 | Sellari, Jr. ...................... | 340/870.02 |
| 3,656,112 | 4/1972 | Paull ................................ | 340/870.02 |
| 3,899,639 | 8/1975 | Cleveley et al. ........... | 340/870.02 X |
| 4,213,119 | 7/1980 | Ward et al. .................... | 340/870.02 |
| 4,315,248 | 2/1982 | Ward .......................... | 340/870.02 X |

Primary Examiner—Jerry W. Myracle
Attorney, Agent, or Firm—Fulwider, Patton, Rieber, Lee & Utecht

[57] ABSTRACT

A system for remote reading of meters such as utility meters comprised of an encoder for generating and storing pulses which can be interrogated as needed to determine usage or for load information. The encoder is comprised of a pulse generator connected to the meter for generating a pulse for each incremental movement of the meter which is then converted to binary coded digital data and stored. A two tone oscillator is provided for reading the stored data over telephone lines. An inhibit circuit inhibits the outputs of the two tone oscillators when the phone line is in use or when there are disturbances on the line.

12 Claims, 2 Drawing Figures

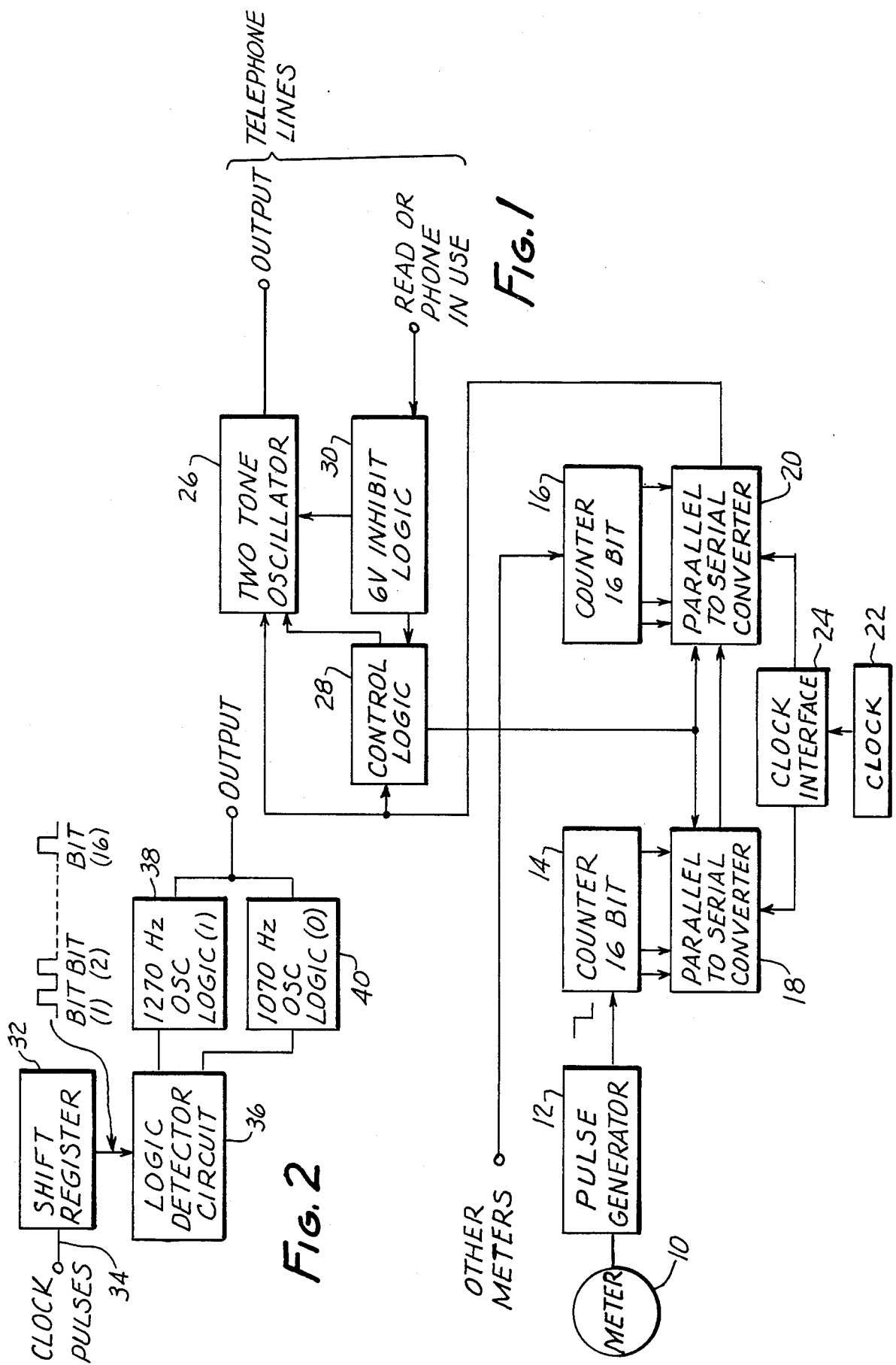

REMOTE METER READING SYSTEM

This is a continuation-in-part of applicant's co-pending U.S. patent application Ser. No. 326,020, filed Nov. 30, 1981 now abandoned, for a Remote Meter Reading System which will be abandoned after the completion of filing of this instant patent application.

SPECIFICATION

FIELD OF THE INVENTION

This invention relates to automatic meter reading systems or particularly relates to the meter reading system which stores the meter information for random reading.

BACKGROUND OF THE INVENTION

Meter reading has been, in the past, a time consuming and expensive task and is particularly difficult in areas where inclement weather, heavy snowfalls, and remote locations prevent meter reading altogether. In these cases they generally estimate the customer usage and bill them accordingly until such time as weather permits actual reading. To solve these problems, systems which use existing telephone lines to provide automatic remote meter reading have been designed. In one such system a switch is opened and closed as the dial on the meter rotates changing DC resistance across the phone line from one value to another and back again. This draws a current on the telephone line which is measured at a central location by monitoring the resulting voltage across the line relay coil. The voltage across the line relay coil is an indicator of the state of the resistor network in the meters connected to the line. Further the state of the resistor network, in turn, is an indicator of the position of the meter dial.

As the resistance switches back and forth between two values a computer at the central location records or stores the consumption for that customer in the computer's memory. The computer at the central location selects the line, scans the network by measuring the current in the line and hence determines the position of the meter dial on that line. In this system the scan cycle repeats frequently, usually every minute taking many more readings than are necessary to detect the encoder state changes which occur over periods of several hours, days or even weeks. Recordings or readings taken during transitions such as telephone in use, ringing or unstable signals on the line are rejected. In this system these signals therefore create interference with the monitoring of utility meters.

BRIEF DESCRIPTION OF THE INVENTION

The purpose of the present invention is to provide a remote meter reading system which stores a record of the meter readings for interrogation only when needed.

The present system uses microtechnology such as integrated circuits to provide an encoder which stores a record of pulses generated by the meter for interrogation as needed. A pulse generator connected to the meter generates pulses for each incremental movement of the meter which are converted to binary coded digital data which is stored in a plurality of shift register modules. The shift register modules may be interrogated by control logic controlling the operation of a two tone oscillator to start and stop the transmission of stored data in a module. The stored data can be read or scanned once a month or a few times a day for determining load information if desired. Integrated circuit chips having sufficient storage for storing the information from three meters, such as gas, water and electric while simultaneously filtering out clock pulses and identifying the data are readily available. The available circuit chips are desirable because they are inexpensive and small. In the event that the monitoring of three meters is not desired, the system could also be used for fire, burglar, or entry alarms. The system as presently provided can be interrogated continuously but does not need to be.

It is one object of the present invention to provide a remote meter reading system which stores the meter usage as binary coded digital data.

Another object of the present invention is to provide a remote meter reading system which permits interrogation as necessary.

Still another object of the present invention is to provide a remote meter reading system which utlizes existing microtechnology.

Yet another object of the present invention is to provide a remote meter reading system which will not lose data when the telephone lines are in use.

Other objects, advantages and novel features of the invention will be apparent from the following detailed description when considered in conjunction with the accompanying drawings, in which:

BRIEF DESCRIPTION OF THE DRAWINGS

FIG. 1 is a simplified block diagram illustrating the remote meter reading system;

FIG. 2 is a block diagram illustrating in greater detail the output transmission section of the circuit of FIG. 1 showing the two tone oscillators that allow the conversion of digital bits to tones for transmission over phone lines.

DETAILED DESCRIPTION OF THE INVENTION

The system mainly consists of a novel encoder which reads and stores the information from utility meters such as an electric gas or water meter. By use of present microtechnology the device will operate with input voltages in the range of 6 to 54 VDC in an ambient temperature range of −40° to 100° C. The purpose of the remote meter reading system is to encode and store numerical information in a binary coded digital form so as to provide upon activation a non-destructive readout equivalent to a plurality of discrete numerical digits of, preferably, 8 or more. The scanning computer for reading, computing and billing customers does not form a part of the present invention.

The invention as shown generally in the block diagram of FIG. 1 includes one or more meters which may be some type of utility meter to be read. Pulse generator 12 is connected to the meter to generate pulses for incremental movements of the meter dials. The output of the pulse generator is fed to sixteen bit counters 14 and 16 and then for conversion to binary coded digital data is fed to and stored in parallel to serial converters 18 and 20. Parallel connected counters 14, 16 are provided to reduce additional circuitry that would be required to individually switch to each incremental dial of a meter. For example, electric meters have five dials depicting 10,000, 1,000, 100, and 10 units. Parallel counters 14, 16 correctly position each dial bit into the shift register (i.e., parallel to serial converters) without the need for additional dial selection or switching circuitry. Multiple meters can be monitored with additional parallel connector counters and shift registers. The parallel to serial converters 18 and 20 are shift registers controlled by clock pulse generator 22 through clock interface circuit 24. Control logic circuit 28 provides switching to control data sequence outputs from parallel to serial connectors 18 and 20. All meter reading systems at a location are synchronized to a single clock output by clock interface circuit 24. In this manner the remote meter reading system encodes and stores numerical information indicating the usage being read by the meter 10.

Meter readings are transmitted by sending an interrogation pulse over phone lines to inhibit logic circuitry 30. Inhibit logic circuitry is a switching circuit which activates two tone oscillator circuit 26 and control logic 28 when an interrogation pulse is received allowing stored digital data (i.e. meter readings) to be converted to tones and transmitted over phone lines. The inhibit logic circuit prevents transmission when there is any disturbance on the line or the phone is in use.

Pulse generator 12 for converting meter movements to a useable signal can be in many forms. For example, conventional meters having a plurality of dial indicators, the conversion can be accomplished in any of the following ways:

1. A reed can be positioned so as to be activated directly (mechanically) by the pointer on the least significant dial.

2. A photo-diode can be positioned to pulse as the black pointer passes across its surface. Should the photo-diode require a light source, power to activate a grain-of-wheat incandescent bulb, an LED, or an electroluminescent light source is readily available at the meter.

3. A small chip of piezo-electric material can be mechanically stressed by passage of the dial pointer to generate its own electrical pulse independent of any outside power source.

4. The dial pointer can pass through the gap in a Hall Effect device to provide a pulse due to change a magnetic field.

These methods can be used to convert the operation of a standard type utility meter to a useable output. Obviously a new meter could be designed that generates the appropriate pulses directly rather than through the mechanically actuating dial pointers could be provided if desired.

The output of the system is in touch tone pairs generated by two tone oscillators 26 controlled by control logic circuit 28 and inhibit logic circuit 30. Control logic circuitry 28 generates set/reset commands for the counters and shift registers and is also activated by inhibit logic 30 when data is requested. Control logic 28 generates write commands during transmission and reset commands in preparation for subsequent interrogation. Two tone oscillator 26 is comprised of a 1070 Hz oscillator and 1270 Hz oscillator to start and stop the transmission of data. Once a user system is identified, a 1270 Hz tone starts transmission of stored data from the first module. A 1070 Hz tone stops transmission of data from the module. In this manner, each module which stores information from a meter is interrogated or scanned and the data transferred to a central office computer for compilation and billing information. Inhibit logic circuit 30 inhibits operation of the two tone oscillator to stop scanning during telephone line use or when there are disturbances on the line.

Inhibit logic circuit 30 detects incoming interrogation pulses and activates control logic circuitry 28 if there are no disturbances on the lines such as the phone being in use. Whenever there are disturbances or the phone is in use inhibit logic 30 will disable the remote meter reading system from the phone lines.

Preferably inhibit logic circuit 30 is comprised of a comparator and a FET (field effect transistor) switch. It will only allow data transmissions when an interrogation signal above a predetermined threshold is received. The FET switch disables the system for disturbances or a "phone in use" signal.

Control logic circuit 28 is preferably comprised of a multivibrator, a steering diode array and AND gates for sequencing the outputs of counters 16 (i.e., shift registers) and parallel to serial converters 18 from a single meter reading system or multiple meter reading systems. A separate sixteen bit counter and parallel to serial converter combination would be provided for each meter. Control logic circuit might sequence the meter reading systems in a gas, water, electric sequence for example. To provide proper identification of the particular meter being read the sequence would be the same for each location. Additionally since sixteen bit counters are used to provide very large storage a portion of the bits in one of the counters can be preset to identify each location in a known manner. For example pull up resistors on perhaps six of the bits in one counter could provide identification. This would still leave more than adequate meter reading capacity of at least 10 bits. In the case of an electric meter having five dials only five bits would be needed to store and transmit the meter reading. However, whatever number of bits are chosen they will be the same for all meter reading systems and all will be transmitted even though perhaps only a portion contain the required data. This will make the data transmission time and the number of bits transmitted the same for all meters and all locations.

Data transmission is initiated by sending an interrogation pulse to inhibit logic circuit 30 which activates control logic circuit 28 and two tone oscillating circuit 26. Control logic 28 then switches the outputs of counters 16 from read to write. A start transmission tone (Ts) is initially generated equal to sixteen clock cycles. Data transmission (TD) then continues with there being one clock cycle for each transmitted bit equal 16 clock cycles. Since there are two tones transmitted the total transmission time is doubled. That is, the total transmission time is two times Tst (TD 2 Ts t TD) for a total maximum transmission time of 64 clock cycles to read out the stored data for each meter reading system. At the end of the transmission time of 64 clock cycles control logic circuit automatically resets counters 14, 16 to read.

The function of two tone oscillator circuit 26 for retrieval of the stored data is to provide a system for the transmission of stored data over phone lines which are computer compatible. One tone frequency is "0" and the other tone frequency is "1". The frequencies chosen in the preferred embodiment are compatible with the characteristics of standard "unconditioned" phone lines. Preferably the output of the system will be in touch tone pairs having frequencies between 500 Hz and 2000 Hz. The interrogation signal will be approximately 100 mV RMS and of as short duration as possible. The return signal will be on the order of 0.1 mV RMS. The interrogation signal (100 mV RMS) is approximately 1000 times the transmitted data signal to provide a threshold for detecting the difference between an interrogation pulse and any other signal on the phone line.

The interrogation is performed by reading out the stored information as shown in greater detail in the block diagram of FIG. 2. The outputs of the counters are fed into shift register 32 which converts the information from parallel to serial form and stores it. A clock circuit input 34 can then be used to step shift register 32 (i.e., parallel to serial converter) along such that for every clock pulse the information is transferred serially, bit by bit, starting with the first bit (1) and continuing in consecutive steps until the sixteenth (16) bit has been reached. In this manner the stored information is read out and the whole sequence can be repeated beginning with an interrogation or identification signal causing the shift register to transfer stored information bit by bit again.

Any number of meters can be read by simply providing additional counters and shift registers to store meter readings. Upon transmission of an identification signal in the form of a short duration (100 mV RMS) interrogation pulse any meter can be read through logic detecting and two tone oscillators.

The information transmitted, being binary, will of course be either a logic one (1) or a logic zero (0). Rather than transmitting a voltage for logic one (1) and no voltage for a logic zero (0) which may be easily disrupted, different frequencies are transmitted for each logic state. This allows trouble free transmission and as was stated previously, enhances compatibility with phone lines. Two tone oscillator circuit 26 is comprised of logic detector 36 and tone oscillators 38 and 40. A logic one (1) or logic zero (0) is sensed by logic detector circuit 36 which activates one of the tone oscillators 38 or 40. A 1270 Hz burst was selected for a logic one (1) and a 1070 Hz burst for a logic zero (0).

The remote meter reading system of the present invention provides a unique and novel method for producing and storing information in binary coded digital form which provides a nondestructive readout which can be interrogated as needed. The information from the meter is stored for reading on a periodic basis such as monthly or may be read a few times a day to provide load information if desired.

This invention is not to be limited by the embodiment shown in the drawing and described in the description, which is given by way of example and not of limitation, but only in accordance with the scope of the appended claims.

I claim:

1. A remote meter reading system for reading meters over unconventional lines such as telephone lines or the like comprising:
   digital pulse generating means for generating a digital pulse representing incremental movements of said meter;
   connecting means connecting such digital pulse generating means to said meter;
   counting means for counting the pulses from said digital pulse generating means;
   storage means for storing the counts from said counting means;
   scanning means for scanning said storage means and converting said counts stored in said storage means to digital information for transmission over said phone lines;
   logic detection means for detecting the logic state of the output from said storage means;
   tone generating means connected to said logic detecting means;
   said tone generating means generating a plurality of tones in a predetermined frequency range representing logic zero or logic one;
   whereby usage recorded by a utility meter may be remotely read.

2. The remote meter reading system according to claim 1 including inhibit means inhibiting an output from said tone generating means when there is a disturbance on said line.

3. The remote meter reading system according to claim 1 in which said counting means comprises at least one binary coded sixteen bit digital counting means.

4. The remote meter reading system according to claim 3 in which said storage means comprises at least one shift register connected to the output of said counting means.

5. The remote meter reading system according to claim 4 in which said storage means comprises parallel to serial converting means.

6. The remote meter reading system according to claim 5 in which said storage means comprises shift register means.

7. The remote meter reading system according to claim 1 in which said tone oscillating means generates tones in a frequency range from 500 to 2000 Hertz.

8. The remote meter reading system according to claim 7 in which said tone oscillating means comprises two tone oscillating means.

9. The remote meter reading system according to claim 8 in which said two tone oscillating means has a first frequency to start the scan of a first set of serial data from said shift register means and second frequency generating means for starting the scan of a second set of serial data; said tones alternating to readout each set of serial data.

10. The remote meter reading system according to claim 7 including inhibit means for inhibiting data transmission during preselected periods.

11. The remote meter reading system according to claim 10 in which said inhibit means inhibits operation of said two tone oscillating means.

12. The remote meter reading system according to claim 11 in which said two tone oscillating means has a first frequency to start the scan of a first set of serial data from said shift register means and second frequency generating means for starting the scan of a second set of serial data; said tones alternating to readout each set of serial data.

* * * * *